(12) United States Patent
Chowdhury et al.

(10) Patent No.: US 12,100,579 B2
(45) Date of Patent: Sep. 24, 2024

(54) DEPOSITION RING FOR THIN SUBSTRATE HANDLING VIA EDGE CLAMPING

(71) Applicant: Applied Materials, Inc., Santa Clara, CA (US)

(72) Inventors: Abhishek Chowdhury, Bangalore (IN); Edwin C. Suarez, Pleasanton, CA (US); Harisha Sathyanarayana, Bangalore (IN); Nataraj Bhaskar Rao, Bangalore (IN); Siqing Lu, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 496 days.

(21) Appl. No.: 16/951,805

(22) Filed: Nov. 18, 2020

(65) Prior Publication Data
US 2022/0157572 A1    May 19, 2022

(51) Int. Cl.
*H01J 37/32* (2006.01)
*C23C 14/00* (2006.01)
(Continued)

(52) U.S. Cl.
CPC .... *H01J 37/32642* (2013.01); *C23C 14/3407* (2013.01); *C23C 14/35* (2013.01);
(Continued)

(58) Field of Classification Search
CPC .......... H01L 21/2656; H01L 21/67017; H01L 21/683; H01L 21/6831; H01L 21/6833; H01L 21/687; H01L 21/68721; H01L 21/68735; H01L 21/68742; H01L 21/6875; H01L 21/68785; H01L 21/677; H01L 21/67739; H01L 21/67748; H01L 21/67751; H01L 21/67763; H01L 21/67766; H01L 21/67778; H01L 21/6779; C23C 14/228; C23C 14/345;
(Continued)

(56) References Cited

U.S. PATENT DOCUMENTS 5,580,388 A  * 12/1996  Moore .............. C23C 16/45589
                                                    118/500
6,296,712 B1   10/2001  Guo et al.
(Continued)

FOREIGN PATENT DOCUMENTS

CN          108796466 B      6/2020

OTHER PUBLICATIONS

PCT International Search Report and Written Opinion PCT/US2021/059407 dated Mar. 14, 2022.

*Primary Examiner* — Benjamin Kendall
*Assistant Examiner* — Joshua Reyes
(74) *Attorney, Agent, or Firm* — MOSER TABOA

(57) ABSTRACT

Embodiments of process kits for use in a process chamber are provided herein. In some embodiments, a process kit for use in a process chamber includes: a deposition ring including a first portion having an first inner ledge and a second portion having a second inner ledge, wherein in a first position, the first portion is spaced from the second portion, and wherein in a second position, the second portion is configured to engage the first portion so that the first inner ledge is aligned with the second inner ledge along a common plane to form a clamping surface.

20 Claims, 7 Drawing Sheets

(51) Int. Cl.
*C23C 14/34* (2006.01)
*C23C 14/35* (2006.01)
*C23C 14/50* (2006.01)
*C23C 16/458* (2006.01)

(52) U.S. Cl.
CPC .......... *C23C 14/50* (2013.01); *C23C 16/4585* (2013.01); *H01J 37/32715* (2013.01); *H01J 2237/20235* (2013.01); *H01J 2237/332* (2013.01)

(58) Field of Classification Search
CPC . C23C 14/351; C23C 14/50; C23C 16/45536; C23C 16/45587; C23C 16/45591; C23C 16/4582; C23C 16/4585; H01J 37/32091; H01J 37/32449; H01J 37/32633; H01J 37/32642; H01J 37/32651; H01J 37/32715
See application file for complete search history.

(56) References Cited

U.S. PATENT DOCUMENTS

| | | | |
|---|---|---|---|
| 8,104,385 B2 | 1/2012 | Hayashi et al. | |
| 9,603,195 B2* | 3/2017 | Mashimo | .......... H01L 21/68764 |
| 10,344,374 B2 | 7/2019 | Hou | |
| 2002/0088771 A1* | 7/2002 | Hixson | ............. H01L 21/68785 |
| | | | 216/67 |
| 2003/0075433 A1* | 4/2003 | Kao | ........................ C23C 14/50 |
| | | | 204/192.12 |
| 2003/0173031 A1* | 9/2003 | Aggarwal | ............. C23C 16/481 |
| | | | 118/728 |
| 2005/0133166 A1* | 6/2005 | Satitpunwaycha | ......................... |
| | | | H01L 21/67069 |
| | | | 156/345.51 |
| 2007/0209931 A1* | 9/2007 | Miller | ............... H01L 21/68735 |
| | | | 204/298.11 |
| 2008/0178801 A1 | 7/2008 | Pavloff et al. | |
| 2009/0050272 A1* | 2/2009 | Rosenberg | .......... C23C 16/4581 |
| | | | 118/728 |
| 2010/0065216 A1 | 3/2010 | Tiller et al. | |
| 2010/0078899 A1* | 4/2010 | Povolny | ............ H01J 37/32724 |
| | | | 279/128 |
| 2012/0042825 A1* | 2/2012 | Hawrylchak | ....... C23C 16/4585 |
| | | | 118/504 |
| 2013/0055952 A1* | 3/2013 | Subramani | ........ H01L 21/68735 |
| | | | 118/725 |
| 2013/0206070 A1* | 8/2013 | Chen | ................... C23C 16/4401 |
| | | | 118/728 |
| 2014/0180822 A1 | 7/2014 | Riker et al. | |
| 2014/0190822 A1* | 7/2014 | Riker | .................. C23C 16/4585 |
| | | | 204/298.11 |
| 2015/0064809 A1* | 3/2015 | Lubomirsky | ..... H01L 21/68792 |
| | | | 438/5 |
| 2015/0221553 A1* | 8/2015 | Ouye | ................ H01L 21/68742 |
| | | | 156/345.37 |
| 2015/0332949 A1 | 11/2015 | Mori | |
| 2017/0011892 A1* | 1/2017 | Guo | ................ H01L 21/68735 |
| 2017/0040199 A1* | 2/2017 | Tsuji | ................ H01L 21/68735 |
| 2018/0277416 A1* | 9/2018 | Takahashi | ........... H01L 21/6831 |
| 2020/0020565 A1* | 1/2020 | Rathnasinghe | ... H01L 21/68742 |
| 2021/0020488 A1 | 1/2021 | Jiong et al. | |

\* cited by examiner

DEPOSITION RING FOR THIN SUBSTRATE HANDLING VIA EDGE CLAMPING

FIELD

Embodiments of the present disclosure generally relate to a substrate processing equipment, and more specifically, to process kits for use in substrate processing equipment.

BACKGROUND

Deposition chambers for processing semiconductor substrates typically include a substrate support to support a substrate. Deposition chambers that use plasma typically include process kits disposed about the substrate support for protecting chamber walls from unwanted deposition and to confine the plasma. Process kits generally include a process shield, cover rings, deposition rings, or the like. Conventionally, the substrate may be retained to the substrate support via electrostatic chucking, vacuum chucking, gravity. However, the inventors have observed that the substrate, especially when thin (i.e., less than about 800 micrometers), may bow, resulting in process non-uniformity. In such cases, the substrate is typically bonded to a carrier plate. However, bonding the substrate adds additional processing time because of the additional bonding and debonding steps and requires additional tooling.

Accordingly, the inventors have provided improved apparatus and methods for flattening substrates.

SUMMARY

Embodiments of process kits for use in a process chamber are provided herein. In some embodiments, a process kit for use in a process chamber includes: a deposition ring including a first portion having an first inner ledge and a second portion having a second inner ledge, wherein in a first position, the first portion is spaced from the second portion, and wherein in a second position, the second portion is configured to engage the first portion so that the first inner ledge is aligned with the second inner ledge along a common plane to form a clamping surface.

In some embodiments, a process chamber for handling a substrate, includes: a chamber body defining an interior volume therein; a substrate support disposed in the interior volume for supporting the substrate thereon; and a deposition ring including a first portion having an first inner ledge and a second portion disposed on the substrate support and having a second inner ledge, wherein in a first position, the first portion is spaced from the second portion, and wherein in a second position, the second portion is configured to engage the first portion so that the first inner ledge is aligned with the second inner ledge along a common plane to form a clamping surface.

In some embodiments, a method of flattening a substrate in a process chamber includes: placing the substrate on a first portion of a deposition ring that is raised with respect to a second portion of the deposition ring; raising the second portion of the deposition ring together with a substrate support to engage the first portion so that the first portion, the second portion, and the substrate support, together, support the substrate; and raising the substrate support to clamp an outer rim of the substrate between the deposition ring and a cover ring.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
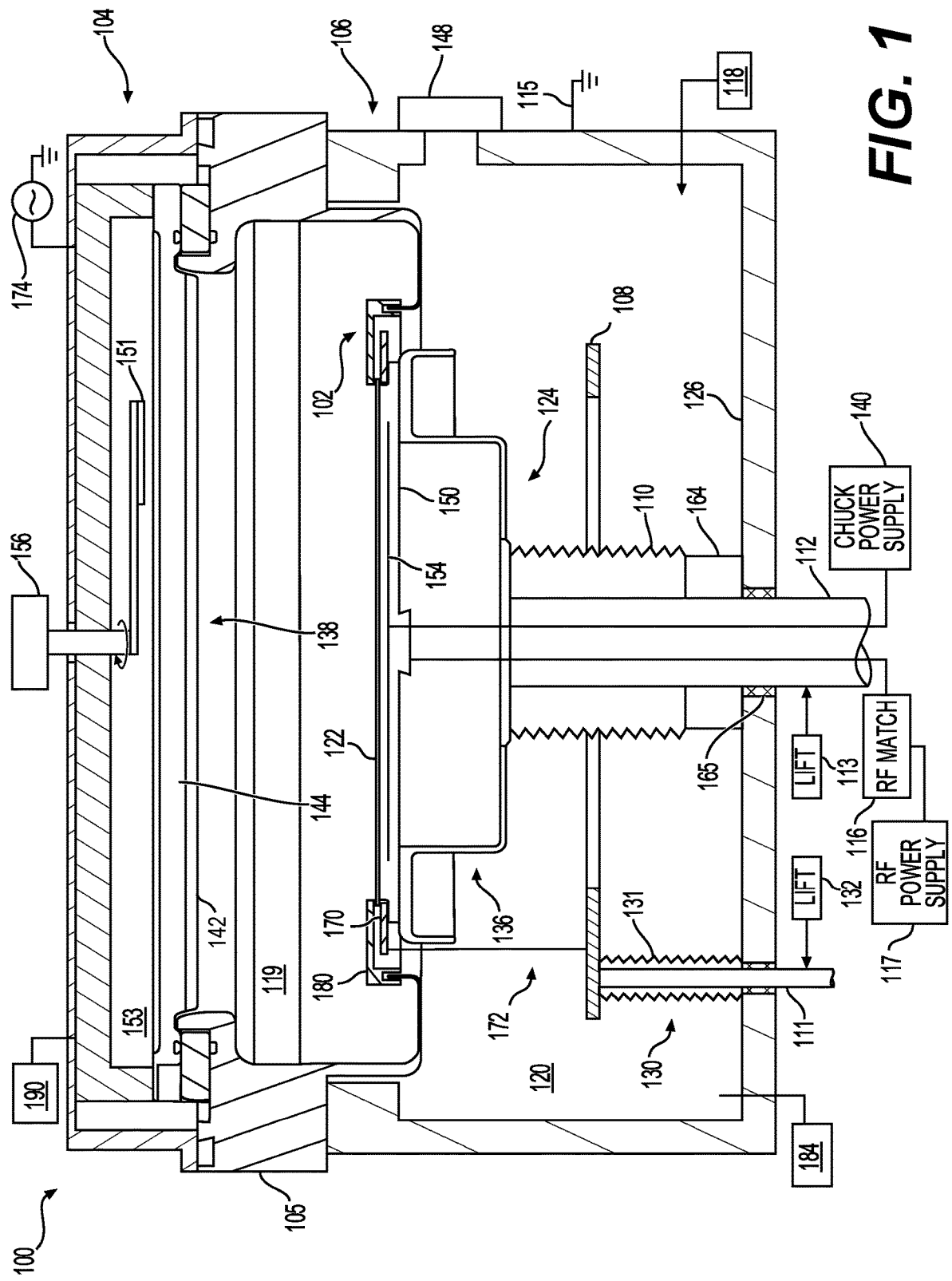
FIG. 1 depicts a schematic cross-sectional side view of process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits for use in a process chamber are provided herein. The inventive process kits advantageously facilitate clamping a peripheral edge of a substrate being processed in the process chamber to flatten the substrate. The use of mechanical clamping advantageously eliminates the use of bonded glass/carriers, shortening processing time by eliminating unneeded steps caused by bonded glass/carriers. The process kit may have features such a plurality of protrusions to advantageously minimize contact with the substrate while providing adequate clamping force. The process kit may have a terminal portion radially inward of the plurality of protrusions to advantageously shield the plurality of protrusions from plasma, which could lead to arcing.

In some embodiments, the substrate is a thin substrate, having a thickness of about 800 micrometers of less. In some embodiments, the substrate is a thin substrate, such as a Taiko wafer, having a thickness of about 30 micrometers to about 175 micrometers at a central portion. Taiko wafers generally include substrates that are back-grinded in the central portion, resulting in an outer rim having a thickness greater than the central portion of the substrate, for example about 175 micrometers to about 800 micrometers. Due to the relatively thin central portion and the thickness differential between the central portion and the outer rim, such wafers often deform, or warp, during processing. In some embodiments, the process kits provided herein are advantageously configured to contact an outer rim of the substrate (having a width of about 1.0 mm to about 3.0 mm) to handle, or flatten, the substrate.

FIG. 1 depicts a schematic cross-sectional side view of process chamber in accordance with at least some embodiments of the present disclosure. In some embodiments, the process chamber 100 is a physical vapor deposition (PVD) process chamber. However, other types of process chambers configured for different processes, for example, etching, chemical vapor deposition (CVD), atomic layer deposition (ALD), or the like, can also use or be modified for use with embodiments of the process kits described herein.

The process chamber 100 is a vacuum chamber which is suitably adapted to maintain sub-atmospheric pressures within an interior volume 120 during substrate processing. The process chamber 100 includes a chamber body 106 covered by a lid assembly 104 which encloses a processing volume 119 located in the upper half of the interior volume 120. The chamber body 106 and lid assembly 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise an electrostatic chuck 150 (or vacuum chuck for process chambers that are not vacuum chambers) disposed on a pedestal 136 and a hollow support shaft 112 for supporting the pedestal 136 and the electrostatic chuck 150. The electrostatic chuck 150 comprises a dielectric plate having one or more electrodes 154 disposed therein. The pedestal 136 is generally made of a metal such as aluminum. The pedestal 136 is biasable and can be maintained at an electrically floating potential or grounded during plasma operation. The hollow support shaft 112 provides a conduit to provide, for example, backside gases, process gases, fluids, coolants, power, or the like, to the electrostatic chuck 150.

Figure 2:
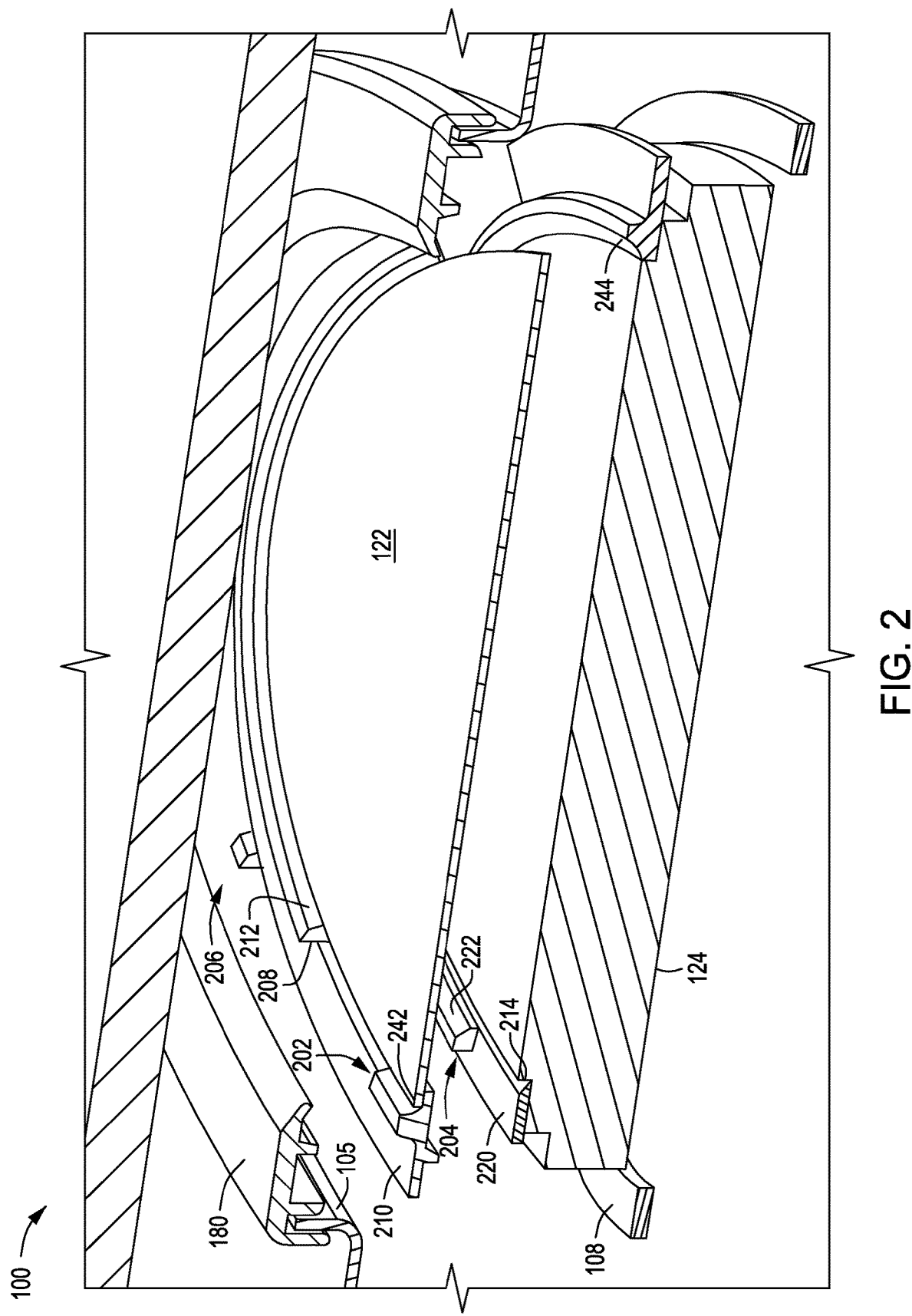
FIG. 2 depicts a cross-sectional isometric view of a portion of a process chamber in a first position in accordance with at least some embodiments of the present disclosure.
Figure 3:
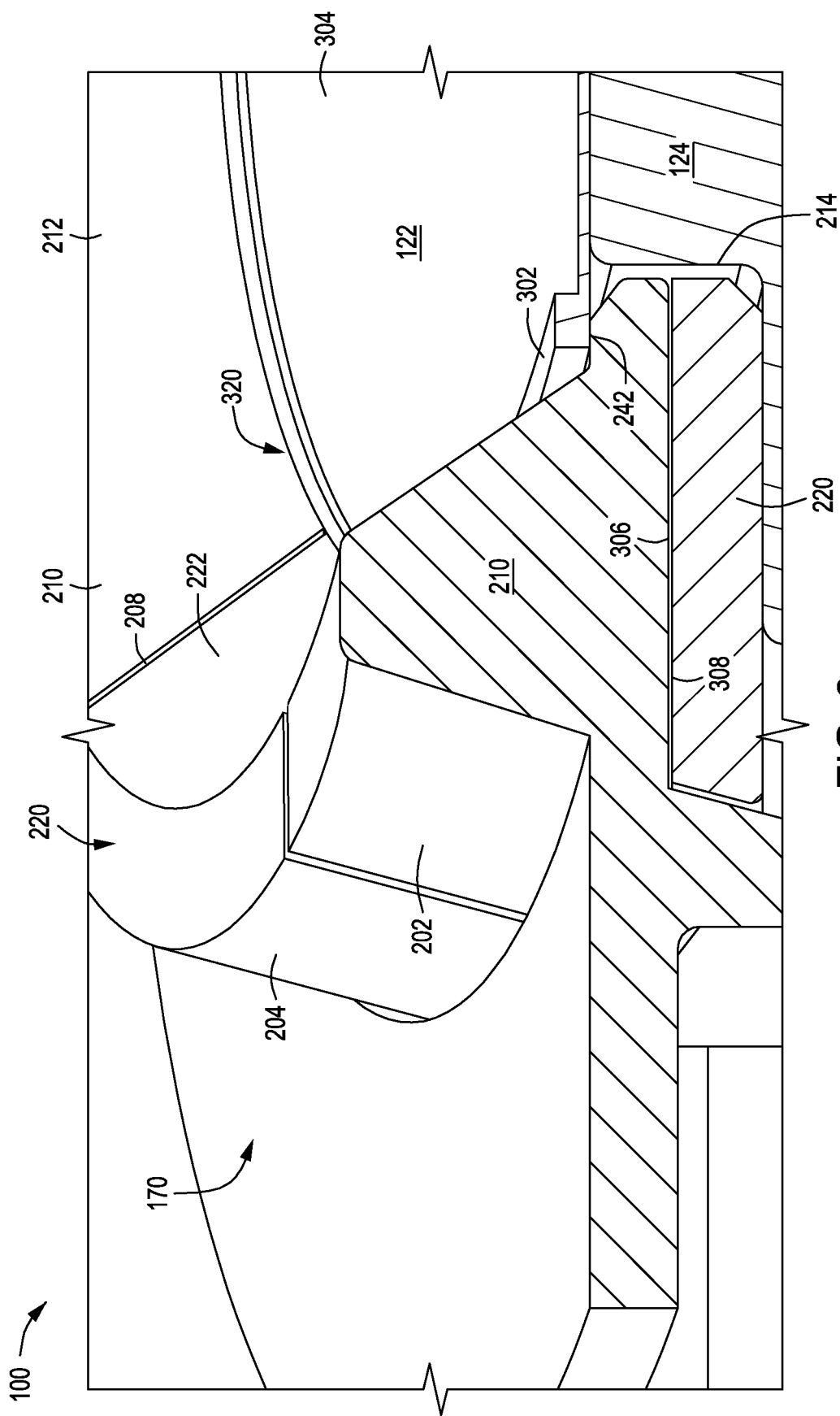
FIG. 3 depicts a cross-sectional isometric view of a portion of a process chamber in a second position in accordance with at least some embodiments of the present disclosure.

In some embodiments, the hollow support shaft 112 is coupled to a lift mechanism 113, such as an actuator or motor, which provides vertical movement of the electrostatic chuck 150 between an upper, processing position (as shown in FIG. 1) and one or more lower, transfer positions (See FIGS. 2 and 3). A bellows assembly 110 is disposed about the hollow support shaft 112 and is coupled between the electrostatic chuck 150 and a floor 126 of process chamber 100 to provide a flexible seal that allows vertical motion of the electrostatic chuck 150 while preventing loss of vacuum from within the process chamber 100. The bellows assembly 110 also includes a lower bellows flange 164 in contact with an o-ring 165 or other suitable sealing element which contacts the floor 126 to help prevent loss of chamber vacuum.

The hollow support shaft 112 provides a conduit for coupling a chuck power supply 140 and RF sources (e.g., RF power supply 174 and RF bias power supply 117) to the electrostatic chuck 150. In some embodiments, the RF power supply 174 and RF bias power supply 117 are coupled to the electrostatic chuck 150 via respective RF match networks (only RF match network 116 shown). In some embodiments, the substrate support 124 may alternatively include AC or DC bias power.

A substrate lift 130 can include a hoop lift 108 connected to a shaft 111 which is coupled to a second lift mechanism 132 for raising and lowering the substrate lift 130 so that the substrate 122 may be placed on or removed from the electrostatic chuck 150 via, for example, a deposition ring 170. In some embodiments, one or more lift members 172 are coupled to the hoop lift 108. The one or more lift members 172 are configured to selectively raise or lower at least a portion of the deposition ring 170. The electrostatic chuck 150 may include through holes to receive the one or more lift members 172. A bellows assembly 131 is coupled between the substrate lift 130 and floor 126 to provide a flexible seal which maintains the chamber vacuum during vertical motion of the substrate lift 130.

A target 138 is disposed in the processing volume 119 opposite the substrate support 124 to at least partially define a process volume therebetween. The substrate support 124 has a support surface having a plane substantially parallel to a sputtering surface of the target 138. The target 138 is connected to one or both of a DC power source 190 and/or the RF power supply 174.

The target 138 comprises a sputtering plate 142 mounted to a backing plate 144. The sputtering plate 142 comprises a material to be sputtered onto the substrate 122. The backing plate 144 is made from a metal, such as, for example, stainless steel, aluminum, copper-chromium or copper-zinc. The backing plate 144 can be made from a material having a thermal conductivity that is sufficiently high to dissipate the heat generated in the target 138, which form from eddy currents that arise in the sputtering plate 142 and the backing plate 144 and also from the bombardment of energetic ions from generated plasma onto the sputtering plate 142.

In some embodiments, the process chamber 100 includes a magnetic field generator 156 to shape a magnetic field about the target 138 to improve sputtering of the target 138. The capacitively generated plasma may be enhanced by the magnetic field generator 156 in which, for example, a plurality of magnets 151 (e.g., permanent magnet or electromagnetic coils) may provide a magnetic field in the process chamber 100 that has a rotating magnetic field having a rotational axis that is perpendicular to the plane of the substrate 122. The process chamber 100 may, in addition or alternatively, comprise a magnetic field generator 156 that generates a magnetic field near the target 138 to increase an ion density in the processing volume 119 to improve the sputtering of the target material. The plurality of magnets 151 may be disposed in a cavity 153 in the lid assembly 104. A coolant such as water may be disposed in or circulated through the cavity 153 to cool the target 138.

The process chamber 100 includes a process kit 102 circumscribing various chamber components to prevent unwanted reaction between such components and ionized process material. In some embodiments, the process kit 102 includes a process shield 105 surrounding the substrate support 124 and the target 138 to at least partially define the processing volume 119. For example, the process shield 105 may define an outer boundary of the processing volume 119. The DC power source 190 can apply a bias voltage to the target 138 relative to the process shield 105. In some embodiments, the process shield 105 is made of a metal such as aluminum.

In some embodiments, the process kit 102 includes the deposition ring 170 that rests on an outer edge of the electrostatic chuck 150. The process kit 102 includes a cover ring 180 disposed on the process shield 105 to form a tortuous gas flow path therebetween. In some embodiments, in the processing position, a radially inner portion of the cover ring 180 rests on the substrate 122 to clamp the substrate 122 against at least one of the deposition ring 170 or the substrate support 124.

The process chamber 100 is coupled to and in fluid communication with a vacuum system 184 which includes a throttle valve (not shown) and vacuum pump (not shown) which are used to exhaust the process chamber 100. The pressure inside the process chamber 100 may be regulated by adjusting the throttle valve and/or vacuum pump. The process chamber 100 is also coupled to and in fluid communication with a process gas supply 118 which may supply one or more process gases to the process chamber 100 for processing the substrate 122 disposed therein. A slit valve 148 may be coupled to the chamber body 106 and aligned with an opening in a sidewall of the chamber body 106 to facilitate transferring the substrate 122 into and out of the chamber body 106.

In use, substrate 122 may be transferred into the interior volume 120 via a transfer robot (not shown). In some embodiments, the substrate lift 130 may raise a first portion 210 of the deposition ring 170 to a first position, above the substrate support 124 (see FIG. 2). In some embodiments, the lift mechanism 113 raises the substrate support 124 and a second portion 220 of the deposition ring 170 to a second position, where the first portion 210 rests on the second portion 220 (see FIG. 3). In some embodiments, the lift mechanism 113 raises the substrate support 124, the first portion 210 of the deposition ring, and the second portion 220 of the deposition ring 170 to a third position, or processing position.

In use, while the DC power source 190 supplies power to the target 138 and other chamber components connected to the DC power source 190, the RF power supply 174 energizes the sputtering gas (e.g., from the process gas supply 118) to form a plasma of the sputtering gas. The plasma formed impinges upon and bombards the sputtering surface of the target 138 to sputter material off the target 138 onto the substrate 122. In some embodiments, RF energy supplied by the RF power supply 174 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. An additional RF power source, (e.g., RF bias power supply 117) can also be used to supply a bias voltage to the substrate support 124 to attract ions form the plasma towards the substrate 122.

FIG. 2 depicts a cross-sectional isometric view of a portion of a process chamber in a first position in accordance with at least some embodiments of the present disclosure. In the first position, a first portion 210 of the deposition ring 170 is disposed above a second portion 220 of the deposition ring 170. The cover ring 180 is disposed above the substrate support 124 and the deposition ring 170 (i.e., the first portion 210 and the second portion 220). In some embodiments, the first portion 210 has an arcuate shape without being a complete ring to accommodate a transfer blade of a transfer robot. The first portion 210 includes a first inner ledge 242 for supporting the substrate 122 thereon.

In some embodiments, the first portion 210 includes a first raised portion 202 having an inner surface 212 disposed radially outward of the first inner ledge 242. In some embodiments the inner surface 212 is sloped to guide the substrate 122 to the first inner ledge 242. In some embodiments, the first raised portion 202 includes an outer surface 430. In some embodiments, the outer surface 430 is sloped similar to an opposing surface of the cover ring 180. In some embodiments, the first portion 210 includes one or more cutouts 208 to accommodate end effectors of the transfer robot. In some embodiments, the one or more cutouts 208 extend through the first raised portion 202. The first portion 210 may rest on one or more support tabs 206 that are coupled to the one or more lift members 172. The one or more support tabs 206 facilitate raising or lowering the first portion 210 with respect to the substrate support 124. The one or more support tabs 206 may have an arcuate shape corresponding with a shape of the first portion 210.

In some embodiments, the second portion 220 rests on or is otherwise coupled to the substrate support 124. In some embodiments, the second portion 220 has an annular shape. In some embodiments, the second portion 220 is disposed in a peripheral groove 214 of the substrate support 124. The second portion 220 includes a second inner ledge 244 for supporting the substrate 122 thereon when in the second position or third position. In some embodiments, the second portion 220 includes a second raised portion 204 having an inner surface 222 disposed radially outward of the second inner ledge 244. The second raised portion 204 may have a shape corresponding with a shape of the first raised portion 202. In some embodiments the inner surface 212 is sloped to guide the substrate 122 to the second inner ledge 244.

FIG. 3 depicts a cross-sectional isometric view of a portion of a process chamber in a second position in accordance with at least some embodiments of the present disclosure. In the second position, the second portion 220 of the deposition ring 170 and the substrate support 124 are raised so that the substrate 122 also rests on the substrate support 124. In the second position, a lower surface 306 of the first portion 210 may rest on an upper surface 308 of the second portion 220. In some embodiments, the first portion 210 and the second portion 220 of the deposition ring 170 may nest into each other so that the inner surface 212 of the first portion 210 is substantially coplanar with the inner surface 222 of the second portion 220. For example, the second raised portion 204 may extend into the one or more cutouts 208 of the first portion 210. In some embodiments, the first portion 210 has an outer diameter greater than an outer diameter of the second portion 220.

In the second position, the first inner ledge 242 and the second inner ledge 244 are configured to align along a common plane to form, together, a clamping surface 320 for an outer rim 302 of the substrate 122 to rest on. In some embodiments, the clamping surface 320 is an annular surface. In some embodiments, the outer rim 302 has a width of about 1.0 mm to about 3.0 mm. In some embodiments, the outer rim 302 has a thickness of about 50 micrometers to about 800 micrometers. In some embodiments, the outer rim 302 has a thickness greater than a central portion 304 of the substrate.

Figure 4:
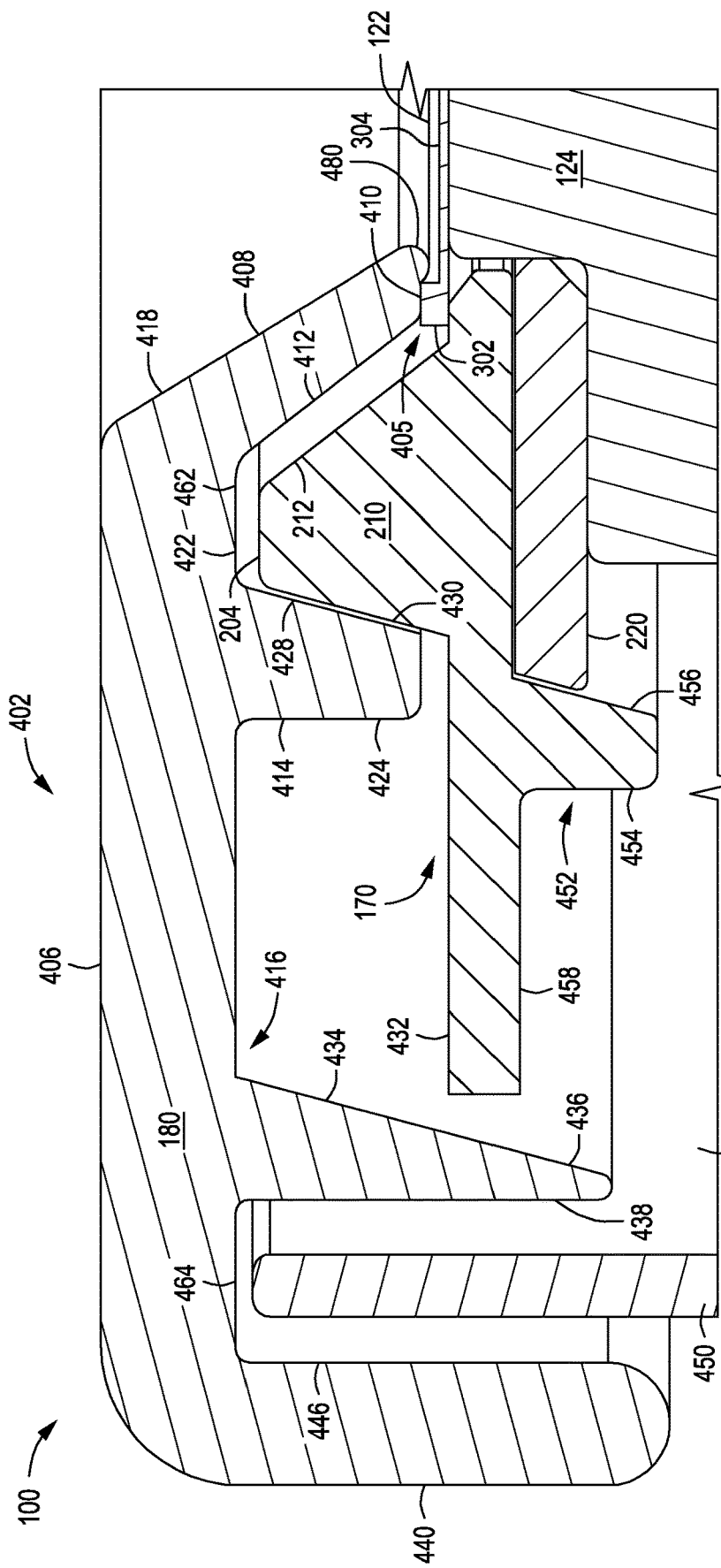
FIG. 4 depicts a cross-sectional side view of a portion of a process chamber in a third position in accordance with at least some embodiments of the present disclosure.

FIG. 4 depicts a cross-sectional side view of a portion of a process chamber in a third position in accordance with at least some embodiments of the present disclosure. The third position is generally a processing position. In the third position, the cover ring 180 is configured to clamp the outer rim 302 of the substrate 122 against the deposition ring 170.

In some embodiments, the first portion 210 of the deposition ring 170 includes an arcuate body 432. The first raised portion 204 extends upward from the arcuate body 432. In some embodiments, the first portion 210 includes a lower ring 452 extending downward from a lower surface 458 of the arcuate body 432. In some embodiments, the lower ring 452 is disposed radially outward of the first raised portion 204. In some embodiments, the lower ring 452 includes an inner surface 456 that extends downward and radially outward from the lower surface 458. In some embodiments, the inner surface 456 is contoured or sloped corresponding to a shape of an opposing surface of the second portion 220. In some embodiments, the lower ring 452 includes an outer surface 454 that extends substantially vertically downward from the lower surface 458.

The cover ring 180 generally has an annular body 402 that includes an upper surface 406 and a lower surface 416. In some embodiments, the cover ring 180 is made of a ceramic material. In some embodiments, an inner lip 408 extends radially inward and downward from the annular body 402. In some embodiments, the inner lip 408 extends radially inward and downward at an angle of about 40 to about 70 degrees from the upper surface 406 of the annular body 402. The inner lip 408 includes an outer surface 412 and an inner surface 418. The inner lip 408 may clamp the substrate 122. The inner lip 408 may include a plurality of protrusions 410 extending downward from the inner lip 408. In some embodiments, the plurality of protrusions 410 extend from an outer surface 412 of the inner lip 408. In some embodiments, the plurality of protrusions 410, together, define a planar substrate contact surface 405 for clamping the substrate 122. In some embodiments, the cover ring 180, when disposed on the deposition ring 170, has a space of about 700 to about 850 micrometers between the clamping surface 320 of the deposition ring 170 and the planar substrate contact surface 405 of the plurality of protrusions 410.

In some embodiments, the cover ring 180 includes a first ring 414 that extends downward from the lower surface 416 of the annular body 402. In some embodiments, the first ring 414 and the inner lip 408 define a first channel 422 therebetween to accommodate the deposition ring 170. In some embodiments, an outer surface 424 of the first ring 414 extends substantially vertically downward from the annular body 402. In some embodiments, an inner surface 428 of the first ring 414 extends downward and radially outward. In some embodiments, a second ring 434 extends downward from the lower surface 416 of the annular body 402. In some embodiments, an inner surface 436 of the second ring 434 extends downward and radially outward. In some embodiments, an outer surface 438 of the second ring 434 extends substantially vertically downward. In some embodiments, the second ring 434 is disposed radially outward of the deposition ring 170.

In some embodiments, an outer lip 440 extends downward from the annular body 402. In some embodiments, the second ring 434 and the outer lip 440 define a second channel 446 therebetween to accommodate an inner lip 450 of the process shield 105. In some embodiments, the inner lip 450 of the of the process shield 105 overlaps with the outer lip 440 of the cover ring 180 to form a tortuous flow path therebetween. In some embodiments, a floor 462 of the first channel 422 is substantially along a same horizontal plane as a floor 464 of the second channel 446.

In some embodiments, the inner lip 408 of the cover ring 180 includes a terminal portion 480 at a radially innermost portion of the inner lip 408. In some embodiments, the terminal portion 480 of the inner lip 408 extends beyond the planar substrate contact surface 405 of the plurality of protrusions 410 to advantageously provide a plasma barrier to reduce or prevent arcing. In some embodiments, the terminal portion 480 includes rounded edges. In some embodiments, the plurality of protrusions 410 have rounded edges.

Figure 5:
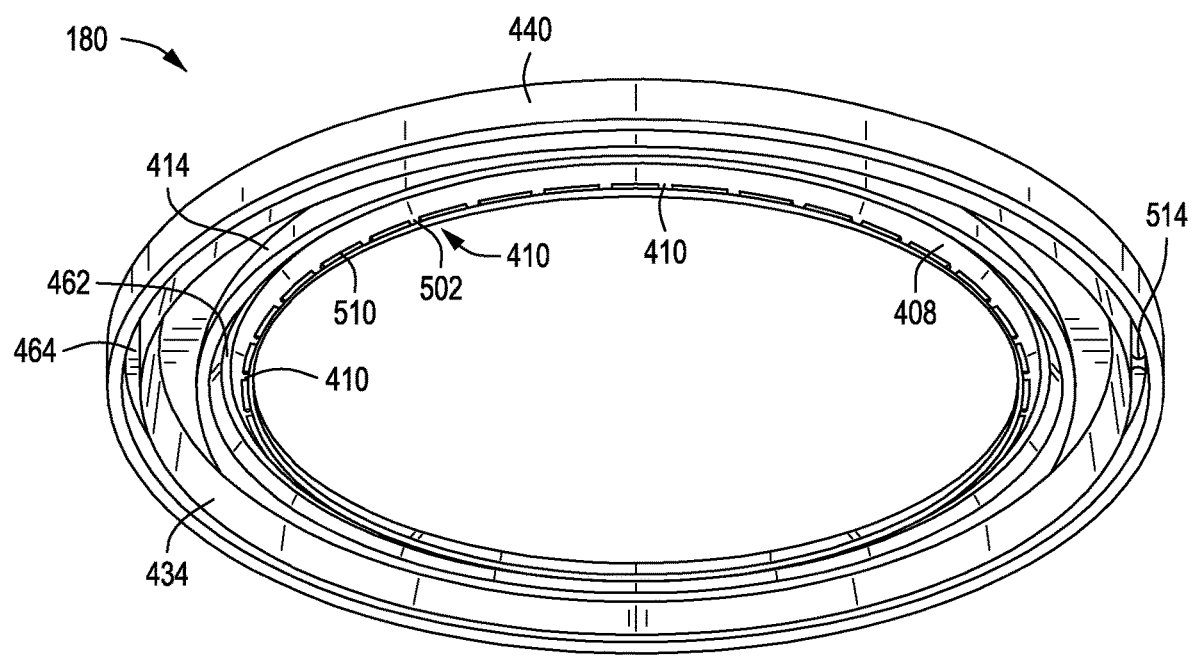
FIG. 5 depicts an isometric bottom view of a cover ring in accordance with some embodiments of the present disclosure.

FIG. 5 depicts an isometric bottom view of a cover ring in accordance with some embodiments of the present disclosure. In some embodiments, as shown in FIG. 5, the plurality of protrusions 410 are disposed at regular intervals along the inner lip 408. In some embodiments, lowermost surfaces 502 of the plurality of protrusions 410, together, define the planar substrate contact surface 405. The plurality of protrusions 410 advantageously provide enough clamping force to flatten the substrate 122 while providing minimum contact points with the substrate 122 to prevent sticking and deposition build up. In some embodiments, each of the plurality of protrusions 410 have a width of about 2.0 mm to about 10.0 mm. In some embodiments, the inner lip 408 includes a plurality of recessed portions 510 disposed between the plurality of protrusions. In some embodiments, the floor 464 of the second channel 446 may include one or more alignment features 514 for aligning the cover ring 180 to the process shield 105. The alignment features 514 may be grooves, slots, pins, or the like.

Figure 6A:
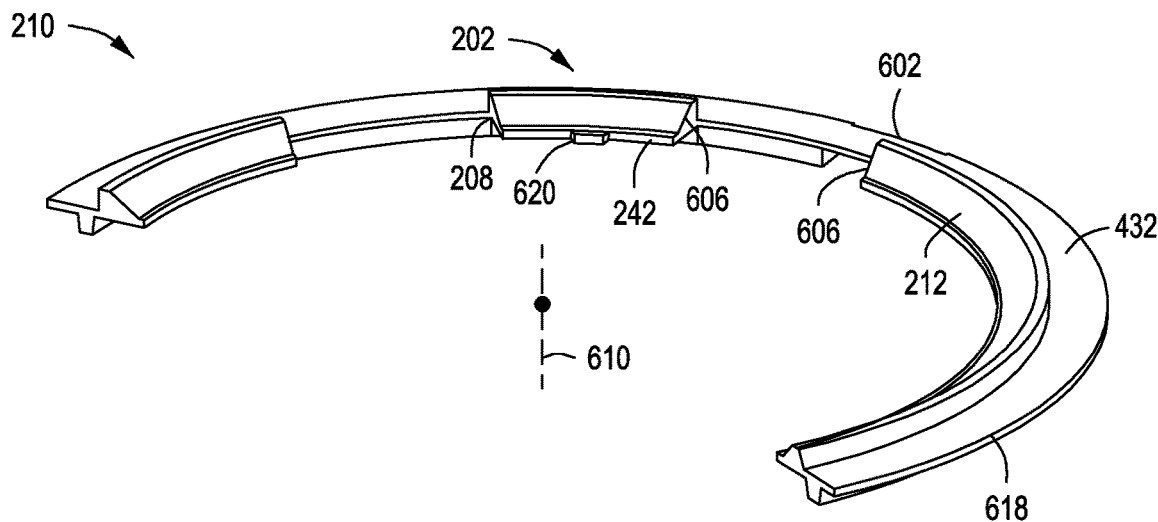
FIG. 6A depicts a top isometric view of a first portion of a deposition ring in accordance with some embodiments of the present disclosure.
Figure 6B:
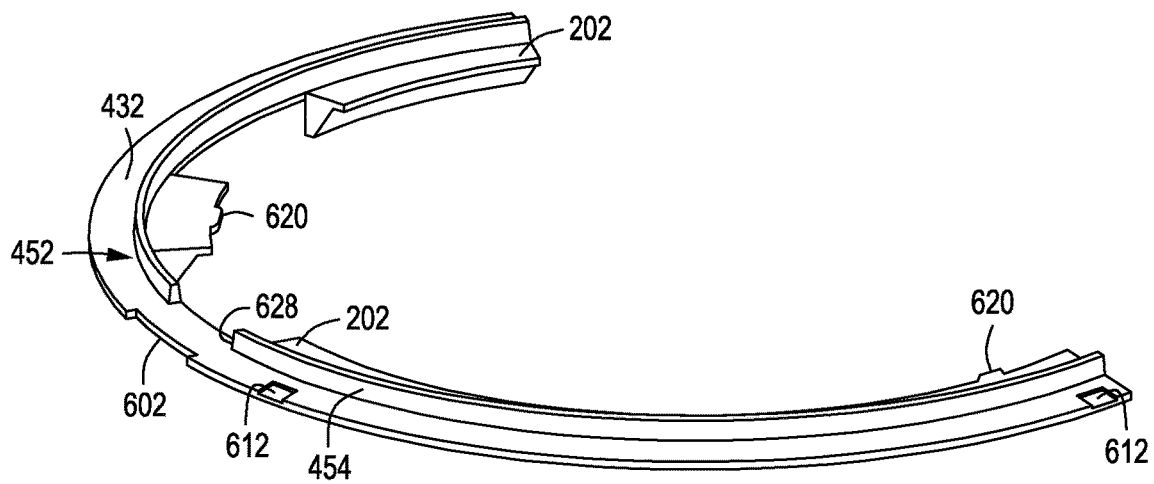
FIG. 6B depicts a bottom isometric view of a first portion of a deposition ring in accordance with some embodiments of the present disclosure.

FIG. 6A depicts a top isometric view of a first portion of a deposition ring in accordance with some embodiments of the present disclosure. FIG. 6B depicts a bottom isometric view of a first portion of a deposition ring in accordance with some embodiments of the present disclosure. In some embodiments, the arcuate body 432 of the first portion 210 extends about 150 to about 250 degrees about a central axis 610 of the first portion 210. In some embodiments, the one or more cutouts 208 of the first portion 210 extend through the first raised portion 202 and portions of the arcuate body 432 vertically below and radially inward from the first raised portion 202. In some embodiments, the one or more cutouts 208 comprise two cutouts.

The first portion 210 includes various alignment features. For example, in some embodiments, opposing sidewalls 606 of the first raised portion 202 defined by each one of the one or more cutouts 208 are sloped towards each other to guide corresponding second raised portions 204 therein when in the second position or third position. In some embodiments, the arcuate body 432 includes an alignment slot 602 configured to facilitate aligning the first portion 210 and the second portion 220. In some embodiments, the alignment slot 602 extends from an outer sidewall 618 of the first portion 210. In some embodiments, the lower ring 452 includes a cutout 628 radially inward from the alignment slot 602. In some embodiments, the first portion 210 includes one or more alignment tabs 620 extending radially inward from the arcuate body 432 to align the deposition ring 170 to the substrate support 124. In some embodiments, the lower surface 458 of the arcuate body 432 may include one or more grooves 612 to accommodate the one or more support tabs 206 for raising or lowering the first portion 210 with respect to the substrate support 124.

Figure 7:
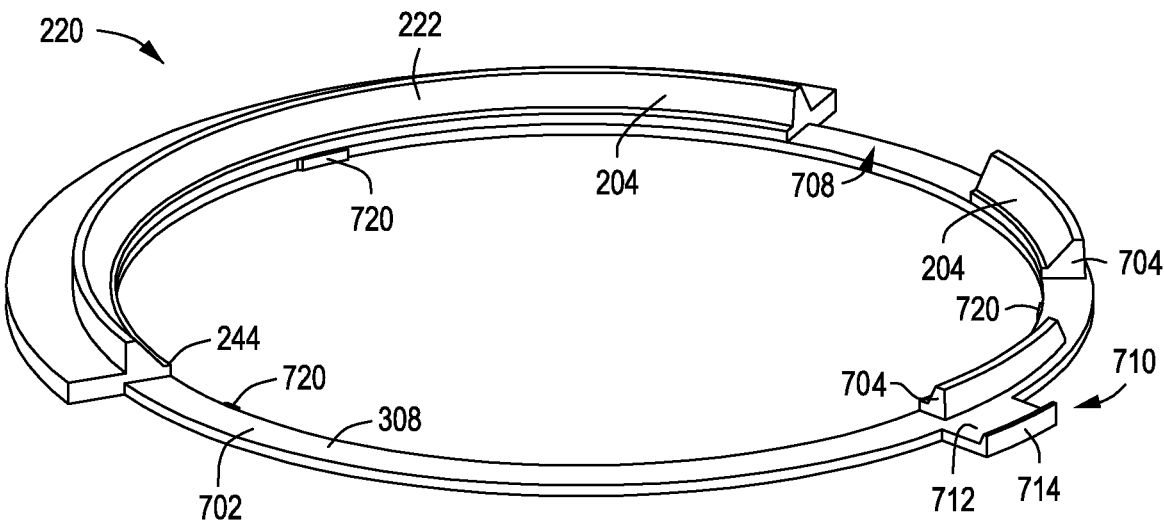
FIG. 7 depicts a top isometric view of a second portion of a deposition ring in accordance with some embodiments of the present disclosure.

FIG. 7 depicts a top isometric view of a second portion of a deposition ring in accordance with some embodiments of the present disclosure. In some embodiments, the second portion 220 includes an annular body 702 having the second raised portion 204 extending upward from the annular body 702. In some embodiments, the second portion 220 includes one or more cutouts 708 sized to accommodate a portion of the first portion 210. For example, the one or more cutouts 708 may accommodate the first raised portion 202 and portions of the arcuate body 432 vertically below and radially inward from the first raised portion 202 such that the inner surface 212 and the first inner ledge 242 of the first portion 210 are substantially aligned with the inner surface 222 and second inner ledge 244, respectively, of the second portion 220. In some embodiments, sidewalls 704 of the second raised portion 204 defined by the one or more cutouts 708 are sloped to guide corresponding first raised portions 202 therein when the first portion 210 rests on the second portion 220.

In some embodiments, a width of the annular body 702 may be greater along portions of the annular body 702 having the second raised portion 204 than portions of the annular body 702 having the one or more cutouts 708. In some embodiments, portions of the annular body 702 having the one or more cutouts 708 may have a width corresponding with a distance between an innermost surface of the first portion 210 and the inner surface 456 of the lower ring 452 of the first portion 210. In some embodiments, an outer diameter of the annular body 702 along portions of the annular body 702 having the second raised portion 204 is substantially similar to an outer diameter of the first portion 210.

In some embodiments, the second portion 220 includes an alignment tab 710 extending outward from the annular body 702. In some embodiments, the alignment tab 710 includes a ledge 712 for the arcuate body 432 to rest on when disposed thereon. In some embodiments, the alignment tab 710 include an outer lip 714 extending upward from the ledge 712. In some embodiments, the outer lip 714 may extend into the alignment slot 602 of the first portion 210. In some embodiments, the second portion 220 may include one or more alignment tabs 720 extending radially inward from the annular body 702 to align the second portion 220 to the substrate support 124.

Figure 8:
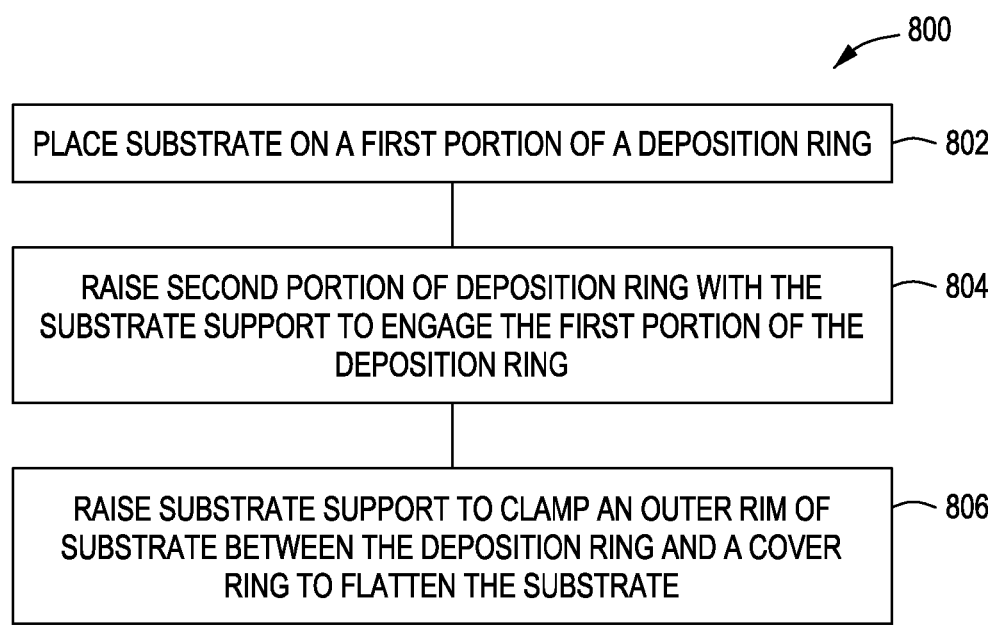
FIG. 8 depicts a method of flattening a substrate in a process chamber in accordance with some embodiments of the present disclosure.

FIG. 8 depicts a method 700 of flattening a substrate (e.g., substrate 122) in a process chamber (e.g., process chamber 100) in accordance with some embodiments of the present disclosure. In some embodiments, the substrate has a thickness of about 20 microns to about 800 microns. In some embodiments, the substrate has a thickness of about 20 microns to about 150 microns. In some embodiments, the process chamber is a PVD chamber. At 802, the method 800 comprises placing the substrate on a first portion (e.g., first portion 210) of a deposition ring (e.g., deposition ring 170), where the first portion is raised with respect to a second portion (e.g., second portion 220) of the deposition ring.

At 804, the second portion of the deposition ring is raised together with a substrate support (e.g., substrate support 124) to engage the first portion 210, where the first portion 210 and the second portion 220, together, form a clamping surface. In some embodiments, a central portion (e.g., central portion 304) of the substrate is electrostatically chucked (e.g., via electrostatic chuck 150) or vacuum chucked to the substrate support.

At 806, the substrate support is raised to clamp an outer rim (e.g., outer rim 302) of the substrate against a cover ring (e.g., cover ring 180) to advantageously flatten the substrate between the deposition ring and the cover ring. In some embodiments, the outer rim comprises a region about 1.0 mm to about 3.0 mm from an outer sidewall of the substrate. In some embodiments, the substrate is clamped between the deposition ring and a plurality of protrusions (e.g., plurality of protrusions 410) to provide minimal contact between the cover ring and the substrate. In some embodiments, once the substrate is clamped, the process chamber performs a subsequent deposition, etching, or cleaning process.

While the foregoing is directed to embodiments of the present disclosure, other and further embodiments of the disclosure may be devised without departing from the basic scope thereof.

The invention claimed is:

1. A process kit for use in a process chamber, comprising:
a deposition ring including a first component having a body having a first inner ledge and a second component separate from the first component and having a second inner ledge, wherein in a first position, the first component is spaced from the second component, and wherein in a second position, the second component is configured to engage with a lower surface of the first component so that the first inner ledge is aligned with the second inner ledge along a common plane to form a clamping surface, wherein the first component includes a lower ring extending downward from a lower surface of the body beyond a lower surface of the second component.

2. The process kit of claim 1, wherein the first component has an arcuate shape and the second component has an annular shape.

3. The process kit of claim 1, wherein the first component includes an arcuate body having a first raised portion extending upward from the arcuate body, wherein the first raised portion includes an inner surface that is sloped and an outer surface, wherein the outer surface is disposed radially inward of the inner surface of the lower ring, and wherein the second component includes an annular body having a second raised portion extending upward from the annular body.

4. The process kit of claim 3, wherein the first component includes a plurality of cutouts sized to accommodate the second raised portion and the component includes a plurality of cutouts sized to accommodate the first raised portion, wherein one of the plurality of cutouts of the second component is larger than another one of the plurality of cutouts of the second component.

5. The process kit of claim 3, wherein the first component includes a plurality of cutouts sized to accommodate the second raised portion and the second component includes a plurality of cutouts sized to accommodate the first raised portion, wherein opposing sidewalls of the first raised portion defined by each one of the plurality of cutouts of the first component are sloped towards each other and configured to guide corresponding ones of the second raised portions therein when in the second position.

6. The process kit of claim 1, wherein in the second position, the first component engages with the second component along a horizontal plane.

7. The process kit of claim 1, wherein the second component includes an alignment tab extending outward from an annular body of the second component, and wherein the alignment tab extends into an alignment slot of the first component when disposed thereon.

8. The process kit of claim 1, further comprising a cover ring, wherein the deposition ring and the cover ring, together, are configured to clamp an outer rim of a substrate.

9. The process kit of claim 8, wherein the cover ring, when disposed on the deposition ring, has a space of about 700 micrometers to about 850 micrometers between a clamping surface of the deposition ring and a planar substrate contact surface of the cover ring.

10. A process chamber for handling a substrate, comprising:
a chamber body defining an interior volume therein;

a substrate support disposed in the interior volume for supporting the substrate thereon; and a deposition ring including a first component having an first inner ledge and a second component disposed on the substrate support and having a second inner ledge, wherein in a first position, the first component is spaced from the second component, and wherein in a second position, the second component is configured to engage the first component so that the first component rests on the second component along a horizontal plane and the first inner ledge is aligned with the second inner ledge along a common plane to form a clamping surface, wherein the first component extends radially outward beyond the second component.

11. The process chamber of claim 10, further comprising a hoop lift disposed in the interior volume and configured to selectively raise or lower the first component with respect to the second component.

12. The process chamber of claim 10, further comprising a cover ring disposed in the interior volume above the deposition ring, wherein the cover ring and the deposition ring are configured to clamp an outer rim of the substrate therebetween via the clamping surface of the deposition ring and a plurality of protrusions disposed at intervals along an inner lip of the cover ring.

13. The process chamber of claim 12, further comprising a process shield disposed in the interior volume about the substrate support, wherein an inner lip of the process shield overlaps with an outer lip of the cover ring to form a tortuous flow path therebetween.

14. The process chamber of claim 10, wherein the first component has an arcuate shape and the second component has an annular shape.

15. A method of flattening a substrate in a process chamber, comprising:
    placing the substrate on the first component of the deposition ring of claim 1 that is raised with respect to the second component of the deposition ring;
    raising the second component of the deposition ring together with a substrate support to engage the first component so that the first component, the second component, and the substrate support, together, support the substrate; and
    raising the substrate support to clamp an outer rim of the substrate between the deposition ring and a cover ring.

16. The method of claim 15, further comprising chucking a central portion of the substrate via an electrostatic chuck.

17. The method of claim 15, further comprising raising the first component to a transfer position prior to placing the substrate on the first component.

18. The method of claim 15, wherein the outer rim of the substrate comprises a region about 1.0 mm to about 3.0 mm from an outer sidewall of the substrate.

19. The method of claim 15, wherein the substrate is clamped between a plurality of protrusions of the cover ring and the deposition ring.

20. The method of claim 15, wherein the substrate has a thickness of about 20 microns to about 800 microns.

* * * * *